United States Patent
Park et al.

(10) Patent No.: US 6,858,452 B2
(45) Date of Patent: Feb. 22, 2005

(54) METHOD FOR ISOLATING SELF-ALIGNED CONTACT PADS

(75) Inventors: Jeong-heon Park, Suwon (KR); Chang-ki Hong, Seoul (KR); Jae-dong Lee, Suwon (KR); Young-rae Park, Suwon (KR); Ho-Young Kim, Sungnam (KR)

(73) Assignee: Samsung Electronics Co., LTD, Kyungki-do (KR)

( * ) Notice: Subject to any disclaimer, the term of this patent is extended or adjusted under 35 U.S.C. 154(b) by 8 days.

(21) Appl. No.: 10/688,610

(22) Filed: Oct. 17, 2003

(65) Prior Publication Data

US 2004/0132223 A1 Jul. 8, 2004

(30) Foreign Application Priority Data

Jan. 7, 2003 (KR) .................... 10-2003-0000837

(51) Int. Cl.[7] .......................................... H01L 21/66
(52) U.S. Cl. .................. 438/14; 438/299; 438/626; 438/694; 438/8
(58) Field of Search .............. 438/14, 299, 626.694, 438/8

(56) References Cited

U.S. PATENT DOCUMENTS

| | | | | |
|---|---|---|---|---|
| 6,268,252 B1 | * | 7/2001 | Lee et al. | 438/299 |
| 6,274,478 B1 | * | 8/2001 | Farkas et al. | 438/626 |
| 6,432,816 B2 | * | 8/2002 | Kim et al. | 438/637 |
| 6,573,173 B2 | * | 6/2003 | Farkas et al. | 438/633 |
| 2002/0036317 A1 | * | 3/2002 | Matsui et al. | 257/315 |
| 2002/0105088 A1 | * | 8/2002 | Yang et al. | 257/774 |
| 2002/0109171 A1 | * | 8/2002 | Lee | 257/296 |

* cited by examiner

*Primary Examiner*—Matthew Smith
*Assistant Examiner*—Victor V Yevsikov
(74) *Attorney, Agent, or Firm*—F. Chau & Associates, LLC

(57) ABSTRACT

A method for isolating SAC pads of a semiconductor device, including determining a chemical mechanical polishing process time necessary to isolate the SAC pads a desired amount by referring to a relationship equation between the extent of isolation of the self-aligned contact pads and the chemical-mechanical polishing process time. The chemical mechanical polishing process is performed for the determined process time on the semiconductor device to isolate the self-aligned contact pads the desired amount. The relationship equation is determined using a test semiconductor device.

16 Claims, 7 Drawing Sheets

METHOD FOR ISOLATING SELF-ALIGNED CONTACT PADS

This application claims priority based on Korean Patent Application No. 2003-00837, filed on Jan. 7, 2003, in the Korean Intellectual Property Office.

BACKGROUND OF THE INVENTION

1. Field of the Invention

The present invention relates to a chemical mechanical polishing (CMP) process for fabricating a semiconductor device, and more particularly, to a CMP process for isolating a self-aligned contact pad.

2. Description of the Related Art

In recent years, as the integration density of semiconductor devices has increased, the line width and the interval between lines have been reduced. Thus, the resolution of a photolithographic process is being markedly increased. However, alignment techniques cannot keep up with the increased resolution. Therefore, it is very important to minimize the generation of misalignment in fabrication processes of semiconductor devices.

To secure the misalignment margin, a self-aligned contact (SAC) process is typically used as a method of forming a pad for electrically connecting upper and lower layers.

FIGS. 1 and 2 are cross-sectional views illustrating a method of forming conventional SAC pads.

Referring to FIG. 1, an isolation region 104 is formed using an active mask (not shown) in a semiconductor substrate 100 to define an active region 102. Next, a gate stack 110 is formed using a gate mask on the semiconductor substrate 100. The gate stack 110 is formed by sequentially stacking and patterning a gate insulating layer 111, a gate conductive layer 112, and a gate-capping layer 113. In some cases, to reduce gate resistance, a metal silicide layer may be formed between the gate conductive layer 112 and the gate-capping layer 113. Afterwards, gate spacers 120 are formed to cover sidewalls of the gate stack 110, and an insulating layer 130 is formed on the semiconductor substrate 100 between the gate spacers 120. The insulating layer 130 is formed of a silicon oxide layer, while the gate spacers 120 and the gate capping layer 113 are formed of a silicon nitride layer having an etch selectivity with respect to the silicon oxide layer.

After forming the gate spacers 120, a mask pattern 160 is formed so as to expose only a portion to be etched. Next, the insulating layer 130, exposed between the gate spacers 120, is etched using the mask pattern 160 as an etch mask. Thus, a contact hole 140 is formed so as to expose a portion of the surface of the semiconductor substrate 100 between the gate spacers 120. While the insulating layer 130 is removed using an etch process, the gate capping layer 113 and the gate spacers 120, which constitute the gate stack 110, are also partially removed. As a result, a step difference d occurs between the gate stack 110 covered with the mask pattern 160 and the gate stack 110 exposed during the etch process.

Referring to FIG. 2, after the etch process for forming the SAC hole is performed, the mask pattern (160 of FIG. 1) is also removed. Next, a conductive material layer (e.g., a polysilicon layer), which will be used as contact pads 150, is formed on the entire surface of the resultant structure. After that, a CMP process is performed to form the contact pads 150, which are isolated from each other by the gate stack 110 on the active region 102 of the semiconductor substrate 100. The contact pads 150 are used as buried contact (BC) pads or direct contact (DC) pads.

As described above, forming the SAC pads requires performing the etch process and the CMP process for forming SAC holes. Also, during the etch process for forming the SAC holes, the gate capping layer 113 is partially removed together with the insulating layer 130. Thus, the step difference d occurs between the adjacent gate stacks 110. The step difference d affects the process time of the subsequent CMP process. That is, the CMP process time required for sufficiently isolating the adjacent SAC pads 150 is varied according to the step difference d.

Conventionally, a CMP process is initially performed on a sample and then whether or not SAC pads are isolated from each other is checked using the sample. Afterwards, the CMP process is performed on a semiconductor substrate by adjusting a CMP process time based on the checked result. However, an etch process for forming SAC holes, which is required before performing the CMP process, may cause a change in the step difference d between the gate stacks 110, which is not considered in the conventional method. Therefore, in a case where the step difference d between the gate stacks 150 is changed by the etch process for forming the SAC holes, the CMP time cannot be appropriately set. As a result, the SAC pads may not be completely isolated from each other.

SUMMARY OF THE INVENTION

The various exemplary embodiments of the present invention provides a method for isolating self-aligned contact (SAC) pads, by which even if the step difference between adjacent gate stacks is changed by an etch process for forming SAC holes, an accurate CMP time can be set.

According to an exemplary embodiment of the present invention, a test semiconductor device including a first test pattern having self-aligned contact holes and a second test pattern is formed. The first test pattern and the second test pattern are formed in the vicinity of a main pattern. A step difference between the first test pattern and the second test pattern is measured. A chemical mechanical polishing process is then performed on the test semiconductor device so as to isolate self-aligned contact pads formed in the self-aligned contact holes of the test semiconductor device. A step difference between the first test pattern and the second test pattern after the chemical mechanical polishing process is measured. A relationship equation among the step difference between the first test pattern and the second test pattern before the chemical mechanical polishing process, the step difference between the first test pattern and the second test pattern after the chemical mechanical polishing process, and an extent of isolation of the self-aligned contact pads formed in the test semiconductor device is then determined. A step difference between a first pattern and a second pattern of the semiconductor device is measured. The first pattern has self-aligned contact holes. An appropriate chemical mechanical polishing time corresponding to the measured step difference between the first pattern and the second pattern of the semiconductor device is then determined by referring to the relationship equation. A chemical mechanical polishing process is performed on the semiconductor device for the estimated chemical mechanical polishing time so as to isolate self-aligned contact pads formed in the self-aligned contact holes of the semiconductor device. A step difference between the first pattern and the second pattern of the semiconductor device after the chemical mechanical polishing process is then measured. The measured step difference between the first pattern and the second pattern of the semiconductor device after the chemical mechanical polishing step is compared with a reference value, the reference value being a step difference necessary to achieve a desired extent of isolation of the self-aligned contact pads. The chemical mechanical polishing time is then corrected for sufficiently isolating self-aligned contact pads based on the comparison result.

Preferably, the relationship equation is set in consideration of a proportional relationship between the first step difference and the CMP time.

Preferably, the relationship equation comprises a proportional relationship between the step difference between the first test pattern and the second test pattern before the chemical mechanical polishing process is performed and the extent of isolation of the SAC pads.

Preferably, the first test pattern and the second test pattern have the same size and the same structure as those of the main pattern.

In at least one embodiment, the main pattern, the first test pattern, and the second test pattern comprise a gate insulating layer, a gate conductive layer, and a gate-capping layer, which are sequentially stacked.

Preferably, before performing the CMP process on the semiconductor device, a conductive layer is formed over the first pattern and the second pattern.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF PREFERRED EMBODIMENTS OF THE INVENTION

The present invention will now be described more fully with reference to the accompanying drawings, in which preferred embodiments of the invention are shown. This invention may, however, be embodied in many different forms and should not be construed as being limited to the embodiments set forth herein.

Figure 1:
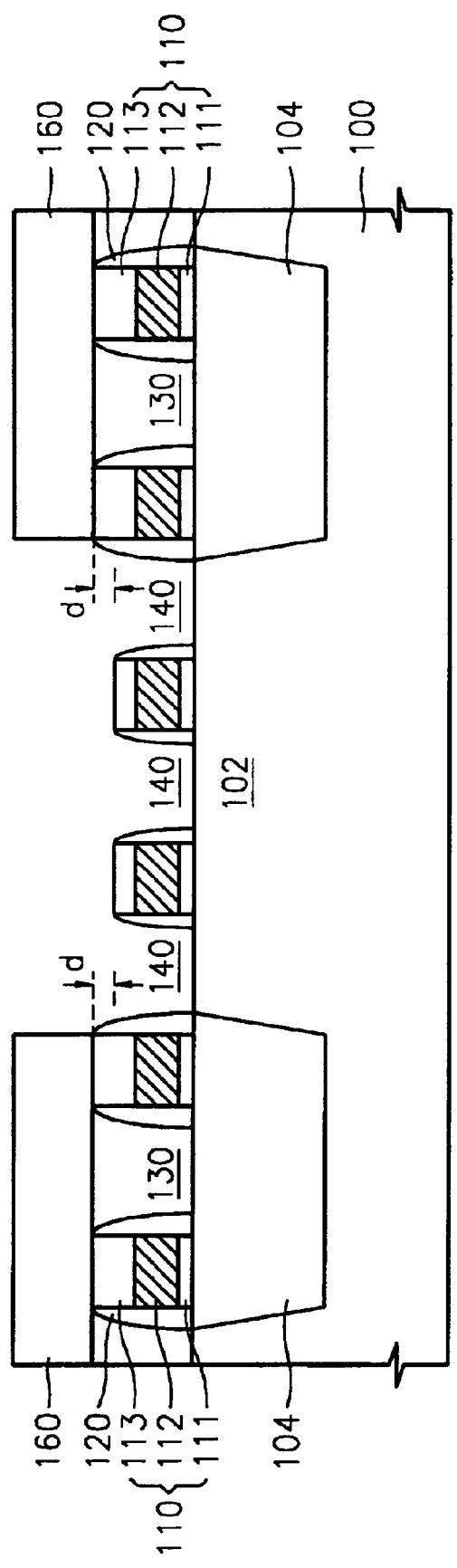
FIGS. 1 and 2 are cross-sectional views illustrating a method of forming conventional SAC pads.
Figure 2:
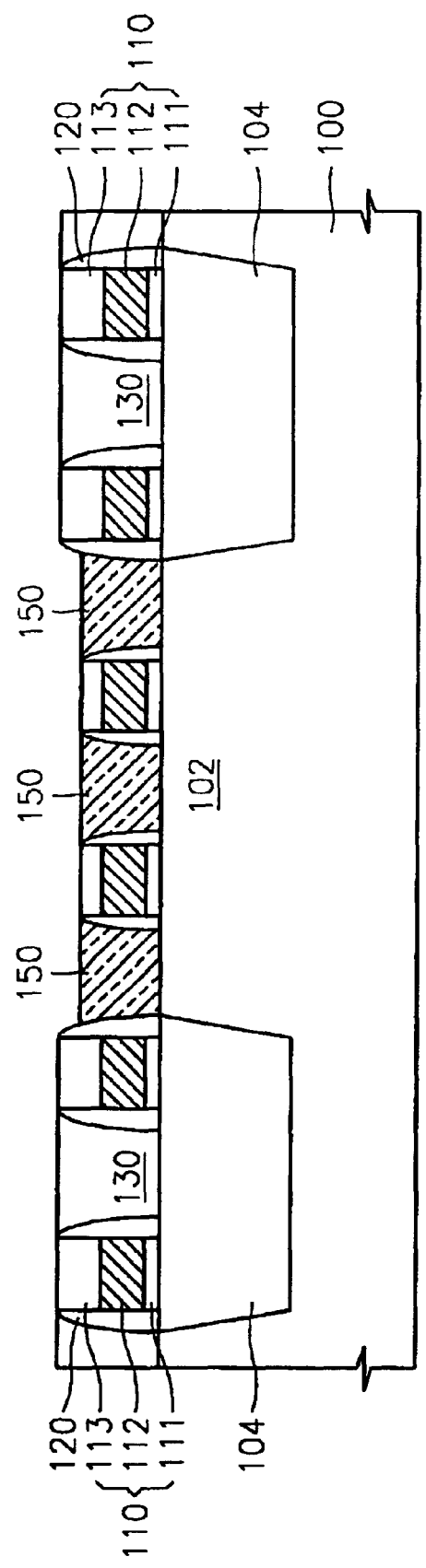
Figure 3:
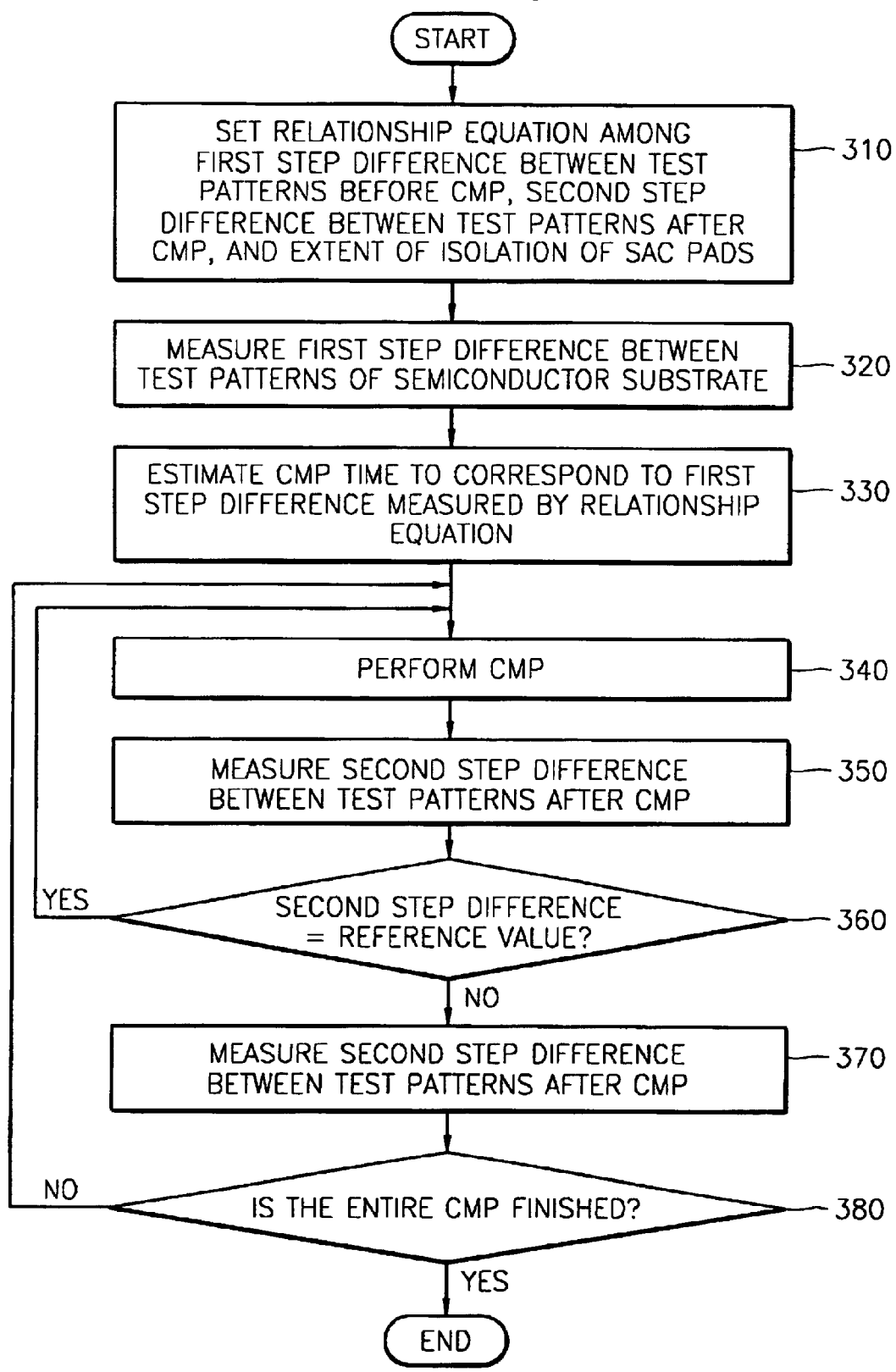
FIG. 3 is a flowchart illustrating a CMP process for isolating SAC pads according to an exemplary embodiment of the present invention.
Figure 4:
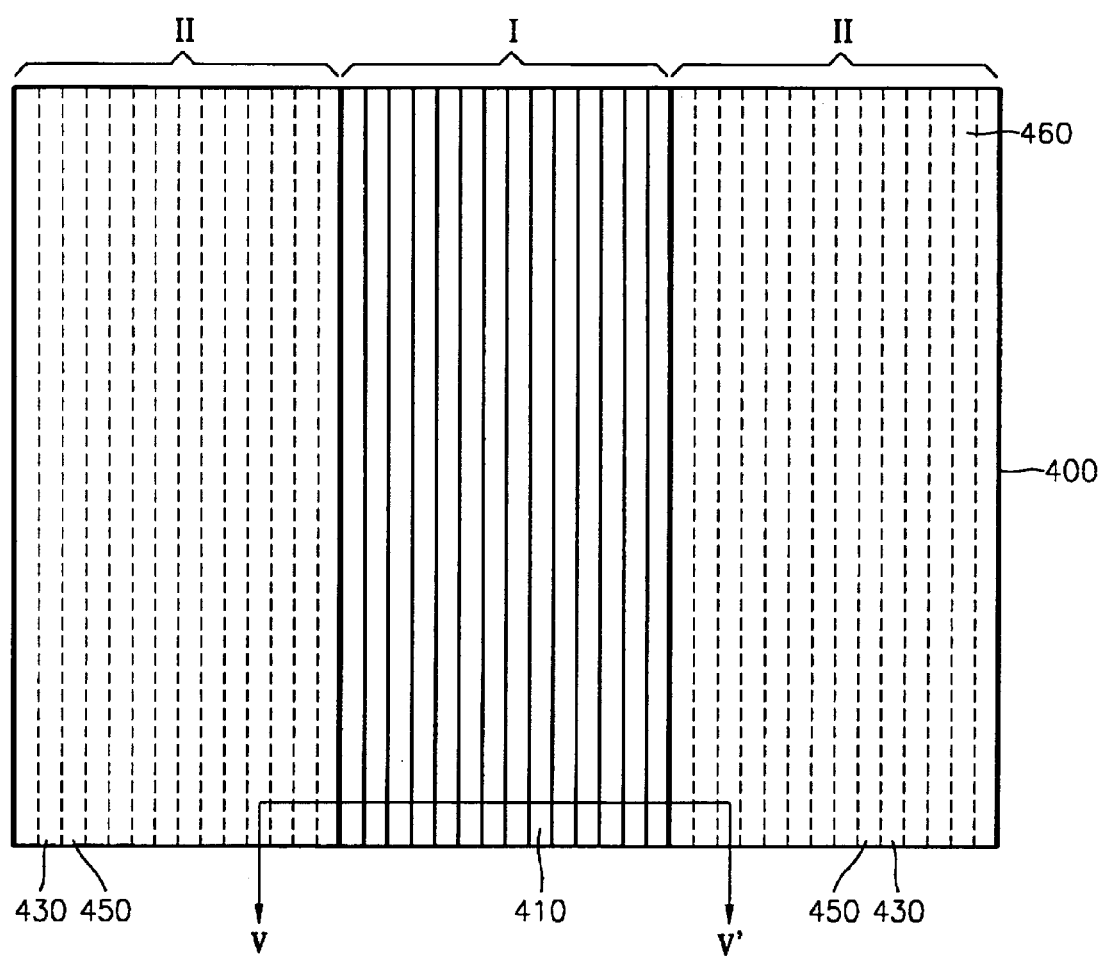
FIG. 4 is a plane view illustrating a step of measuring a first step difference according to an exemplary embodiment of the present invention.
Figure 5:
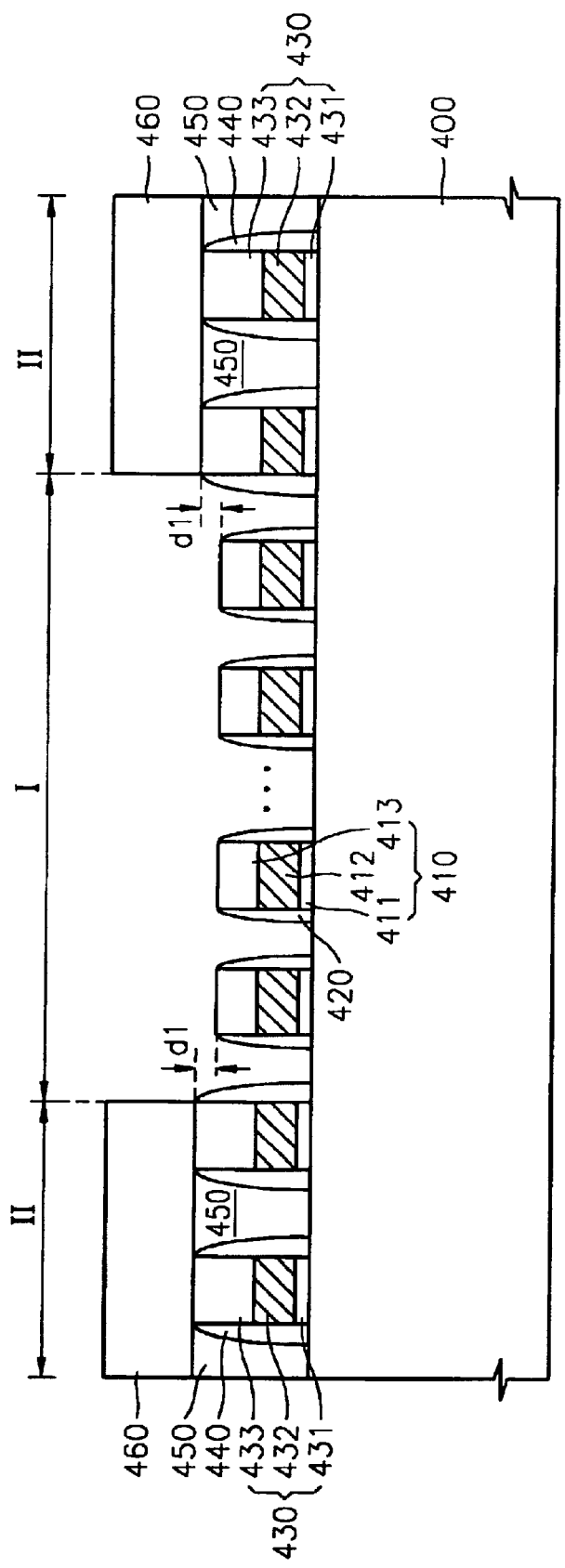
FIG. 5 is a cross-sectional view taken along line V-V' of FIG. 4.
Figure 6:
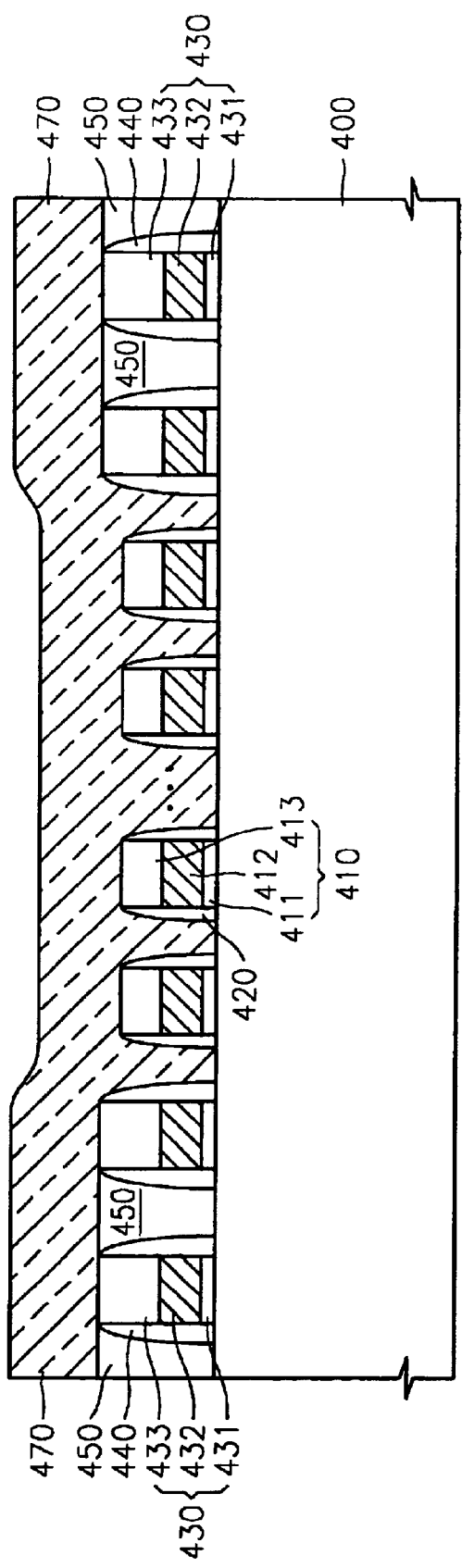
FIGS. 6 and 7 are cross-sectional views illustrating a step of measuring a second step difference according to an exemplary embodiment of the present invention.
Figure 7:
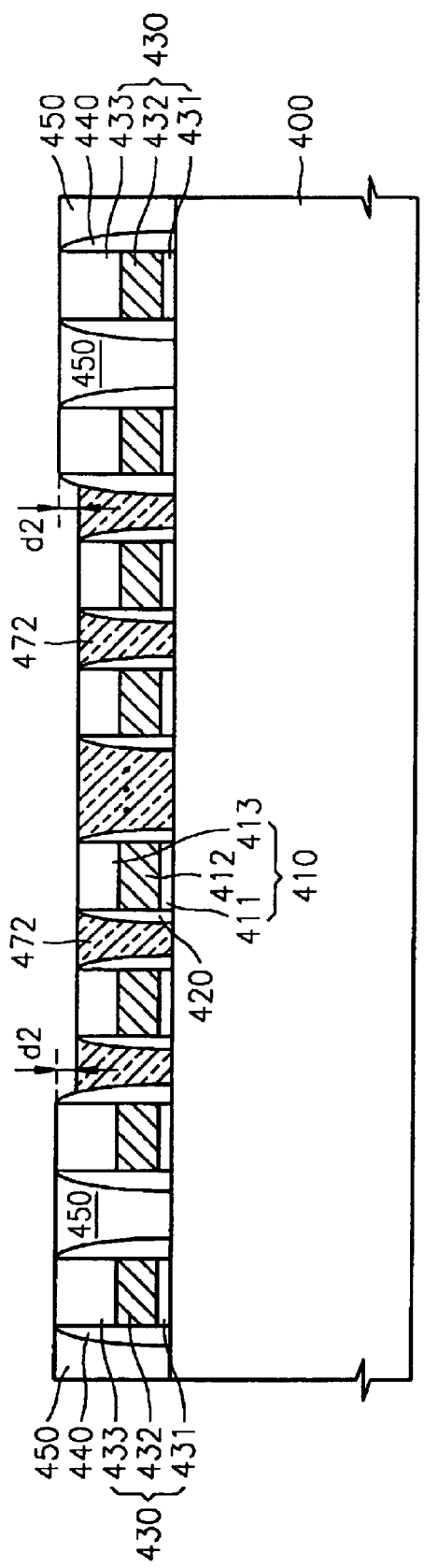

FIG. 3 is a flowchart illustrating a CMP process for isolating SAC pads according to an exemplary embodiment of the present invention. FIG. 4 is a plane view illustrating a step of measuring a first step difference according to an exemplary embodiment of the present invention. FIG. 5 is a cross-sectional view taken along line V-V' of FIG. 4. Also, FIGS. 6 and 7 are cross-sectional views illustrating a step of measuring a second step difference according to an exemplary embodiment of the present invention.

Referring to FIG. 3, by using a semiconductor substrate in which test patterns are formed, a relationship equation is set among a first step difference between the test patterns before the CMP process for isolating the SAC pads, a second step difference between the test patterns after the CMP process, and the extent of isolation of the SAC pads (step 310). That is, the first step difference between the test patterns is measured after performing an etch process for forming SAC holes or before performing the CMP process. Next, a conductive layer for the SAC pads is formed. Afterwards, the CMP process is performed to isolate the SAC pads. Here, the second step difference between the test patterns and the extent of isolation of the SAC pads are measured. Finally, the relationship equation is set among the measured first step difference, the measured second step difference, and the extent of isolation of the SAC pads.

To measure the first step difference, as shown in FIGS. 4 and 5, the semiconductor substrate 400 including the test patterns is manufactured. The semiconductor substrate includes a first region I, which is opened during the formation of the SAC holes, and a second region II, which is not opened. Main patterns and test patterns are formed in each of the first region I and the second region II. That is, a plurality of first test patterns 410 are disposed on the first region I of the semiconductor substrate 400 and spaced apart from each other by a regular interval, and a plurality of second test patterns 430 are disposed on the second region II of the semiconductor substrate 400 and spaced apart from each other by a regular interval. The first test pattern 410 and the second test pattern 430 are gate stacks having the same size and structure.

The first test pattern 410 comprises a first gate insulating layer 411, a first gate conductive layer 412, and a first gate capping layer 413, which are sequentially stacked. In some cases, to reduce the gate resistance, a metal silicide layer may be formed between the first gate conductive layer 412 and the first gate-capping layer 413. First gate spacers 420 are disposed on the sidewalls of the first test pattern 410. Similarly, the second test pattern 430 comprises a second gate insulating layer 431, a second gate conductive layer 432, and a second gate capping layer 433, which are sequentially stacked. In some cases, a metal silicide layer for reducing gate resistance may be formed between the second gate conductive layer 432 and the second gate-capping layer 433. Second gate spacers 440 are disposed on the sidewalls of the second test patterns 430. The first gate conductive layer 412 and the second gate conductive layer 432 are formed of a polysilicon layer, while the first gate spacers 420, the second gate spacers 440, the first gate capping layer 413, and the second capping layer 433 are formed of a silicon nitride layer.

After removing a mask pattern (460 of FIG. 5) or after forming a conductive layer (e.g., a polysilicon layer) for SAC pads on the entire surface of the resultant structure, a step difference is measured using a step difference measuring unit. To perform an etch process for forming SAC holes, a mask pattern 460 is formed so as to expose the first region I and cover the second region II. The mask pattern 460 covers the insulating layer 450 between the second test patterns 430. On the other hand, the mask pattern 460 exposes the insulating layer (not shown) between the first test patterns 410. In this state, the etch process for forming the SAC holes is performed. The etch process is performed until a partial surface of the semiconductor substrate 400 is exposed in the first region I. During the etch process, the second test pattern 430 and the insulating layer 450 within the second region II can maintain their heights by the mask pattern 460. However, the insulating layer (not shown) within the first region I is completely removed, and the first test pattern 410 does not maintain its height. While the insulating layer within the first region I is etched, since the first test pattern 410 is also exposed, the gate capping layer 413 of the first test pattern 410 is etched by a certain thickness. The etch rate of the gate capping layer 413 is determined by an etch selectivity between the gate capping layer 413 and the insulating layer. After the etch process for forming the SAC holes is completed, the first step difference d1 occurs between the first test pattern 410 of the first region I and the second test pattern 430 of the second region II. The first step difference d1 can be measured after cutting open a test semiconductor substrate, removing the mask pattern (460 of FIG. 5), or forming the conductive layer 470 (e.g. a polysilicon layer) for SAC pads.

Next, to measure the second step difference, as shown in FIG. 6, the mask pattern (460 of FIG. 5) is removed and the conductive layer 470 (e.g., a polysilicon layer) for the SAC pads is formed. Afterwards, as shown in FIG. 7, the CMP process is performed to completely isolate the SAC pads from each other in the first region I. After the CMP process is completed, not only the first test pattern 410 of the first region I but also the second test pattern 430 of the second region II are reduced in height. Thus, the second step difference d2 occurs between the first test pattern 410 of the first region I and the second test pattern 430 of the second region II. Due to the selectivity between the polysilicon layer 470 and the second test pattern 430, the second step difference d2 becomes larger as the CMP process time increases. The second step difference d2 can be measured using a measuring unit installed in a CMP apparatus or an additional step difference measuring unit. Meanwhile, in addition to the second step difference d2, the extent of isolation of the SAC is also measured. The extent of isolation of the SAC pads 472 can be calculated by measuring the width of the SAC pads 472.

As a result, the first step difference d1 before the CMP process, the second step difference d2 after the CMP process, and the extent of isolation of the SAC pads 472 are in a particular relationship where as the first step difference d1 becomes lower, the CMP process time decreases, thus reducing the second step difference d2. As a result, the extent of isolation of the SAC pads 472 is reduced. Inversely, as the first step difference d1 becomes higher, the CMP process time increases, thus increasing the second step difference d2. As a result, the extent of isolation of the SAC pads 472 is increased. An equation expressing a specific relationship can be obtained by using experimental results.

After performing step 310, an etch process for forming SAC holes is performed on a semiconductor substrate, and the first step difference d1 between the first test pattern of the first region and the second test pattern of the second region is measured (step 320). Since a step of measuring the first step difference d1 is the same as the step of measuring the first step difference of the test semiconductor substrate, the description will be omitted. Next, a conductive layer for SAC pads is formed using a polysilicon layer. After that, a CMP process time is set to correspond to the first step difference d1 measured by the relationship equation obtained in step 310 (step 330). Then, the CMP process is performed for the pre-set CMP process time (step 340).

After performing the CMP process, the second step difference d2 between the first test pattern of the first region I and the second test pattern of the second region II is measured (step 350). Since a step of measuring the second step difference d2 is the same as the step of measuring the second step difference of the test semiconductor substrate, the description will be omitted. Next, whether or not the second step difference d2 is the same as a reference value is determined (step 360). Here, the reference value is a second step difference that enables a desired extent of isolation of the SAC pads. If it is determined that the second step difference d2 is the same as the reference value, i.e., the extent of isolation of the SAC pads reaches the desired extent, the CMP process is performed on the next semiconductor substrate under the same conditions. However, if it is determined that the second step difference d2 is not the same as the reference value, i.e., the extent of isolation of the SAC pads does not reach the desired extent, the CMP process time is appropriately corrected by referring to the relationship equation obtained in step 310 (step 370). Next, whether or not all of the semiconductor substrates underwent the CMP process is determined (step 380). If it is determined that all of the semiconductor substrates underwent the CMP process, the entire CMP process is completed. However, if it is determined that there are remaining semiconductor substrates to undergo the CMP process, the process is fed into step 340 and the CMP process is performed on the next semiconductor substrate. Here, the next semiconductor substrate undergoes the CMP process for the CMP process time corrected in step 370.

As described above, according to the present invention, when the CMP process for isolating the SAC pads is performed, the etch rate of the gate capping layer, which is etched during the etch process for forming SAC holes, can be considered. That is, a relationship equation is set using the test semiconductor substrate where test patterns are formed, and the CMP process time can be corrected on the basis of the relationship equation. Therefore, even if the step difference between adjacent gate stacks is changed due to the etch process for forming SAC holes, the CMP process time can be set appropriately.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A method for isolating self-aligned contact pads of a semiconductor device, the semiconductor device including a first pattern having self-aligned contact holes and a second pattern, comprising:

forming a test semiconductor device, the test semiconductor device having a first test pattern having self-aligned contact holes and a second test pattern, the first test pattern and the second test pattern being formed in the vicinity of a main pattern;

measuring a step difference between the first test pattern and the second test pattern;

performing a chemical mechanical polishing process on the test semiconductor device so as to isolate self-aligned contact pads formed in the self-aligned contact holes of the test semiconductor device;

measuring a step difference between the first test pattern and the second test pattern after the chemical mechanical polishing process;

setting a relationship equation among the step difference between the first test pattern and the second test pattern before the chemical mechanical polishing process, the step difference between the first test pattern and the second test pattern after the chemical mechanical polishing process, and an extent of isolation of the self-aligned contact pads formed in the test semiconductor device;

measuring a step difference between the first pattern and the second pattern of the semiconductor device;

estimating an appropriate chemical mechanical polishing time corresponding to the measured step difference between the first pattern and the second pattern of the semiconductor device by referring to the relationship equation;

performing a chemical mechanical polishing process on the semiconductor device for the estimated chemical mechanical polishing time so as to isolate self-aligned contact pads formed in the self-aligned contact holes of the semiconductor device;

measuring a step difference between the first pattern and the second pattern of the semiconductor device after the chemical mechanical polishing process;

comparing the measured step difference between the first pattern and the second pattern of the semiconductor device after the chemical mechanical polishing step with a reference value, the reference value being a step difference necessary to achieve a desired extent of isolation of the self-aligned contact pads; and correcting the chemical mechanical polishing time for sufficiently isolating self-aligned contact pads based on the comparison result.

2. The method of claim 1, wherein the relationship equation is set in consideration of a proportional relationship between the step difference between the first test pattern and the second test pattern before the chemical mechanical polishing process and chemical mechanical polishing time.

3. The method of claim 1, wherein the relationship equation comprises a proportional relationship between the step difference between the first test pattern and the second test pattern after the chemical mechanical polishing process and the extent of isolation of the self-aligned contact pads formed in the test semiconductor device.

4. The method of claim 1, wherein the first test pattern and the second test pattern have a same size and a same structure as those of the main pattern.

5. The method of claim 4, wherein the main pattern, the first test pattern, and the second test pattern comprise a gate insulating layer, a gate conductive layer, and a gate capping layer, which are sequentially stacked.

6. The method of claim 1, wherein before performing the chemical mechanical polishing process on the semiconductor device, a conductive layer is formed over the first pattern and the second pattern.

7. A method for isolating self-aligned contact pads of a semiconductor device, comprising:

determining a chemical mechanical polishing process time necessary to isolate the self-aligned contact pads a desired amount by referring to a relationship equation between the extent of isolation of the self-aligned contact pads and the chemical-mechanical polishing process time;

performing a chemical mechanical polishing process for the determined process time on the semiconductor device to isolate the self-aligned contact pads the desired amount.

8. The method of claim 7, wherein the relationship equation is determined using a test semiconductor device.

9. The method of claim 7, further comprising:

etching the semiconductor device to form self-aligned contact holes.

10. The method of claim 9, further comprising:

forming a conductive layer over the self-aligned contact holes before performing the chemical mechanical polishing process.

11. A semiconductor device, comprising:

a first pattern having self-aligned contact holes and a second pattern; and self-aligned contact pads formed in the self-aligned contact holes, wherein the semiconductor device is formed by a process comprising:

forming a test semiconductor device, the test semiconductor device having a first test pattern having self-aligned contact holes and a second test pattern, the first test pattern and the second test pattern being formed in the vicinity of a main pattern;

measuring a step difference between the first test pattern and the second test pattern;

performing a chemical mechanical polishing process on the test semiconductor device so as to isolate self-aligned contact pads formed in the self-aligned contact holes of the test semiconductor device;

measuring a step difference between the first test pattern and the second test pattern after the chemical mechanical polishing process;

setting a relationship equation among the step difference between the first test pattern and the second test pattern before the chemical mechanical polishing process, the step difference between the first test pattern and the second test pattern after the chemical mechanical polishing process, and an extent of isolation of the self-aligned contact pads formed in the test semiconductor device;

measuring a step difference between the first pattern and the second pattern of the semiconductor device;

estimating an appropriate chemical mechanical polishing time corresponding to the measured step difference between the first pattern and the second pattern of the semiconductor device by referring to the relationship equation;

performing a chemical mechanical polishing process on the semiconductor device for the estimated chemical mechanical polishing time so as to isolate self-aligned contact pads formed in the self-aligned contact holes of the semiconductor device;

measuring a step difference between the first pattern and the second pattern of the semiconductor device after the chemical mechanical polishing process;

comparing the measured step difference between the first pattern and the second pattern of the semiconductor device after the chemical mechanical polishing step with a reference value, the reference value being a step difference necessary to achieve a desired extent of isolation of the self-aligned contact pads; and correcting the chemical mechanical polishing time for sufficiently isolating self-aligned contact pads based on the comparison result.

12. The semiconductor device of claim 11, wherein the relationship equation is set in consideration of a proportional relationship between the step difference between the first test pattern and the second test pattern before the chemical mechanical polishing process and chemical mechanical polishing time.

13. The semiconductor device of claim 11, wherein the relationship equation comprises a proportional relationship between the step difference between the first test pattern and the second test pattern after the chemical mechanical polishing process and the extent of isolation of the self-aligned contact pads formed in the test semiconductor device.

14. The semiconductor device of claim 11, wherein the first test pattern and the second test pattern have a same size and a same structure as those of the main pattern.

15. The semiconductor device of claim 14, wherein the main pattern, the first test pattern, and the second test pattern comprise a gate insulating layer, a gate conductive layer, and a gate capping layer, which are sequentially stacked.

16. The semiconductor device of claim 11, wherein before performing the chemical mechanical polishing process on the semiconductor device, a conductive layer is formed over the first pattern and the second pattern.

* * * * *